United States Patent
Kameyama et al.

(10) Patent No.: US 6,997,006 B2
(45) Date of Patent: Feb. 14, 2006

(54) COOLING DEVICE

(75) Inventors: Susumu Kameyama, Tokyo (JP); Yu Seshimo, Tokyo (JP); Yasufumi Hatamura, Tokyo (JP); Masaoki Ino, Tokyo (JP); Hiroyuki Kobayakawa, Tokyo (JP); Toshihiko Enomoto, Tokyo (JP); Makoto Saitou, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/478,215

(22) PCT Filed: Mar. 24, 2003

(86) PCT No.: PCT/JP03/03516

§ 371 (c)(1),
(2), (4) Date: Nov. 28, 2003

(87) PCT Pub. No.: WO03/084300

PCT Pub. Date: Oct. 9, 2003

(65) Prior Publication Data

US 2004/0148948 A1  Aug. 5, 2004

(30) Foreign Application Priority Data

Mar. 28, 2002 (JP) ............... 2002-092435

(51) Int. Cl.
*F25D 23/12* (2006.01)
(52) U.S. Cl. .............. 62/259.2; 62/333; 361/688
(58) Field of Classification Search .......... 62/126, 62/132, 175, 259.2, 333, 335, 330; 361/688
See application file for complete search history.

(56) References Cited

U.S. PATENT DOCUMENTS

| | | | | |
|---|---|---|---|---|
| 4,796,439 A | * | 1/1989 | Yamada et al. | 62/159 |
| 5,406,807 A | * | 4/1995 | Ashiwake et al. | 62/376 |
| 5,655,381 A | * | 8/1997 | Huttenlocher et al. | 62/259.2 |
| 5,740,679 A | * | 4/1998 | Ueno et al. | 62/175 |
| 6,539,736 B1 | | 4/2003 | Isazawa et al. | |

FOREIGN PATENT DOCUMENTS

| | | |
|---|---|---|
| JP | 4-16588 | 4/1992 |
| JP | 74491/1992 | 6/1992 |
| JP | 5-145261 | 6/1993 |
| JP | 9-116285 | 5/1997 |
| JP | 2694515 | 9/1997 |
| JP | 10-300128 | 11/1998 |
| JP | 11-182895 | 7/1999 |
| JP | 2000-349478 | 12/2000 |
| JP | 2001-41503 | 2/2001 |
| KR | 2001-0021050 | 3/2001 |

* cited by examiner

*Primary Examiner*—Melvin Jones
(74) *Attorney, Agent, or Firm*—Oblon, Spivak, McClelland, Maier & Neustadt, P.C.

(57) ABSTRACT

A cooling system that has a heat exchanger which is housed in one enclosure and is constituted of a plurality of heat exchange modes, and the heat exchanger includes a refrigerant forced circulation mode, a refrigerant natural circulation mode, and a ventilation mode. A temperature detector performs switching to an optimal mode, to thereby cool the inside of the enclosure of a housing accommodating equipment including a heat-generating component.

13 Claims, 6 Drawing Sheets

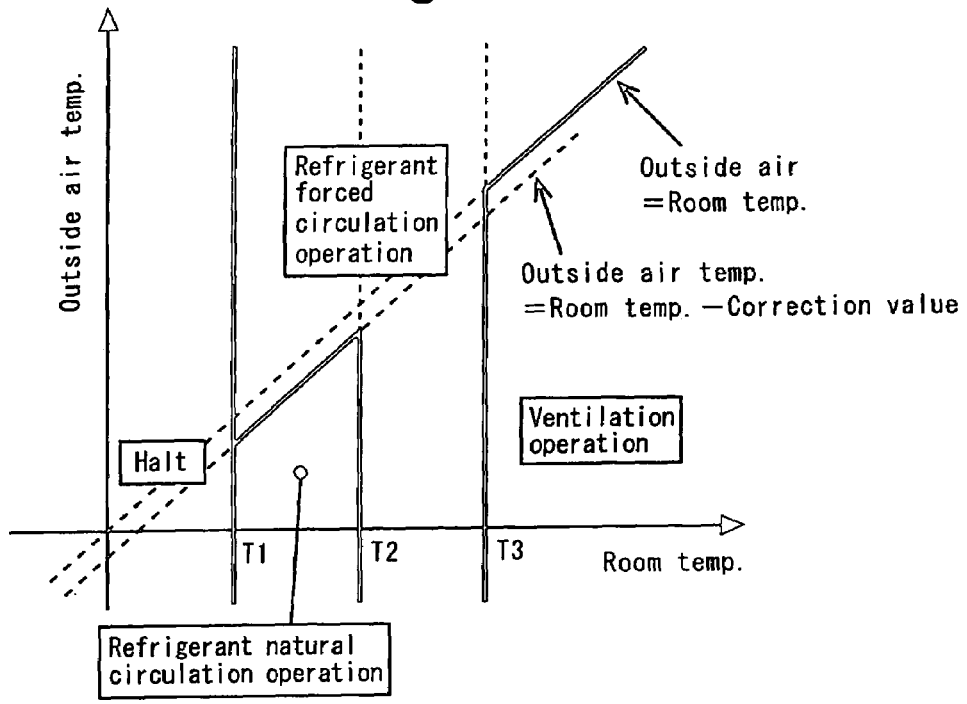

|  | Control state | | | |
| --- | --- | --- | --- | --- |
|  | Halt | Refrigerant forced circulation operation | Refrigerant natural circulation operation | Ventilation operation |
| Compressor 2 | OFF | ON | OFF | OFF |
| Outdoor fan 4 | OFF | ON | ON | ON |
| Indoor fan 8 | OFF | ON | ON | ON |
| Indoor air inlet port 12 | Open | Open | Open | Close |
| Outside air inlet port 13 | Open | Open | Open | Close |
| Ventilation indoor air inlet port 14 | Close | Close | Close | Open |
| Ventilation outside air inlet port 15 | Close | Close | Close | Open |

COOLING DEVICE

FIELD OF THE INVENTION

The invention relates to a cooling system, and more particularly, to a cooling system to be provided in an enclosure of a housing which accommodates a heat-generating equipment having a built-in sensible-heat-generating element, such as a substrate.

BACKGROUND ART

In relation to housing which is an object of cooling, heat-generating equipment is generally housed in a sealed enclosure. The enclosure has a narrow space which inhibits entry of a person. Equipment housed in the enclosure has heat-generating components and hence is cooled appropriately.

A cooling system described in Japanese Patent Application Laid-Open No. 041503/2001 is mentioned as a cooling system for cooling the inside of such an enclosure. FIG. 9 shows the cooling system.

As shown in FIG. 9, an enclosure cooling system 51 of a housing 52 is configured to cool the inside of an enclosure 53 of the housing 52 that forms a closed space, by means of an auxiliary cooling device indoor unit 59 and an auxiliary cooling device outdoor unit 60, which are closed with a natural circulation refrigerant circuit 65; and a main cooling device indoor unit 61 and a main cooling device outdoor unit 62, which are closed with a forced circulation refrigerant circuit 66 for forcefully circulating refrigerant with a compressor 74. Heat-generating equipment 54 including heat-generating components is housed in the enclosure 53.

In the case of the common heat-generating equipment 54, a fan (not shown) is provided within an equipment case 56 which houses a heat-generating component 55. Air is taken into the case from an air intake 57 provided in a side surface or bottom surface of the case. Hot air is issued from an air outlet 58 provided in an upper portion of the case. The enclosure 53 has an outside air inlet ventilation fan 63 and an exhaust damper 64 for preventing an internal temperature of the enclosure from exceeding a given level in the event of occurrence of an anomaly in the enclosure cooling system. Cooling capacity of the conventional cooling system is determined so as to meet the maximum load of the heat-generating component 55. The enclosure 53 usually has a structure which involves considerably low heat transmission. Hence, variations in outside air temperature do not cause any substantial variations in cooling load in the enclosure 53.

Operation of the enclosure cooling system 51 of the housing 52 will now be described.

During normal operation, cool air located at a position "B" on the side of the equipment case 56 is taken into the case from the air intake 57, by means of driving of a fan (not shown) provided in the heat-generating equipment 54. The thus-taken-in cool air cools the heat-generating component 55, to thereby become hot air. The hot air is blown from the air outlet 58 provided in an upper portion of the case to a position "C" within the housing 53. In this way, the thus-issued hot air is taken into the auxiliary cooling device indoor unit 59 from a position "D" by way of a hot air intake 70 by means of blowing action of a main cooling device indoor unit fan 67. The hot air is subjected to primary cooling by exchanging heat with refrigerant of the natural circulation refrigerant circuit 65. After having been blown by the main cooling device indoor unit fan 67 through suction, a total amount of the air located at a position "E" that has been subjected to primary cooling passes through a main cooling device indoor unit evaporator 72, where heat is exchanged with the refrigerant of the forced circulation refrigerant circuit 66, and hence the air is cooled. The thus-cooled air is blown as cool air from a cool air outlet 71 to a position "A" within the enclosure 53. Namely, the air cools the inside of the enclosure 53 by sequentially circulating through positions "A, B, C, D, and E".

When the main cooling device indoor unit fan 67 becomes inoperative for reasons of a failure or when no power is supplied to the main cooling device indoor unit fan for reasons of a power failure, the heat-generating equipment 54 operates at all times by means of a backup power supply (not shown). However, since the cooling system becomes inoperative, the internal temperature of the enclosure 53 increases. Temperature detection means 73 for detecting an anomaly is provided within the enclosure 53. When the temperature detected by the temperature detection means 73 has exceeded a certain temperature (e.g., 40° C.), the ventilation fan 63 and the exhaust damper 64 operate, to thereby simultaneously take in outside air and exhaust air from the inside of the enclosure 53. If the temperature detected by the temperature detection means 73 continuously increases (to, e.g., 45° C.) despite the exhausting operation, a warning is issued to a control center. Thus, the cooling system operates in two steps.

Such a conventional cooling system is constituted of four components; namely, a main cooling device, an auxiliary cooling device, a ventilation fan, and an exhaust damper. Further, the dimensions of the enclosure have already been determined. Hence, a detailed review is required to determine locations of the respective components. Particularly, the auxiliary cooling device indoor unit is equipment for enhancing an energy saving characteristic. Setting the auxiliary cooling device indoor unit in the vicinity of an air outlet of heat-generating equipment results in a greater effect but poses a problem of limitations of space.

The ventilation fan is for protecting heat-generating equipment in the event of an anomaly in the cooling system. Hence, setting the ventilation fan close to the heat-generating equipment is preferable, as in the case of the auxiliary cooling device indoor unit. Thus, setting pieces of equipment at a single position is desirable, and hence assignment of installation places requires consumption of time at the time of examination of a layout which yields system effectiveness. Moreover, a plurality of pieces of equipment are disposed outside the enclosure, which induces projections and depressions and impairs the appearance of the cooling system.

The conventional cooling system requires a large number of pieces of constituent equipment, which involves complicated setting work. Particularly, an auxiliary cooling device is of a refrigerant natural circulation system. Hence, if piping work is not appropriately laid such that a refrigerant pipe for connecting an outdoor unit with an indoor unit is sloped forward, the cooling system will fail to exhibit cooling capability.

The invention has been conceived to solve such a conventional problem and aims at providing a cooling system which simplifies the design of facilities and setting work by housing a plurality of heat exchange means, which constitute a cooling system, in one enclosure and making them operative; which makes an attempt to save energy by appropriately controlling a plurality of heat exchange means; and which prevents occurrence of a cooling failure, which would otherwise be associated with a failure in installation work.

DISCLOSURE OF THE INVENTION

A cooling system of the invention is one which cools the inside of an enclosure of a housing accommodating equipment including a heat-generating element, the system comprising heat exchange means constituted of a plurality of heat exchange modes, wherein the heat exchange means is housed in one enclosure.

In the cooling system of the invention, the plurality of heat exchange modes include a refrigerant forced circulation mode, a refrigerant natural circulation mode, and a ventilation mode.

In the cooling system of the invention, a cooling system main body is attached to a side surface of the enclosure of the housing.

In the cooling system of the invention, a refrigerant forced circulation circuit of the refrigerant forced circulation mode and a refrigerant natural circulation circuit of the refrigerant natural circulation mode are constituted as a single refrigerant circuit.

In the cooling system of the invention, a refrigerant forced circulation circuit of the refrigerant forced circulation mode and a refrigerant natural circulation circuit of the refrigerant natural circulation mode are respectively constituted as different refrigerant circuits.

The cooling system of the invention has first temperature detection means for detecting a temperature of outside air, and second temperature detection means for detecting an internal temperature of the enclosure of the housing. On the basis of the temperatures detected by the first and second temperature detection means and a preset correction value, there is effected switching between the refrigerant forced circulation circuit and the refrigerant natural circulation circuit.

The cooling system of the invention controls a temperature by regulating the quantity of refrigerant circulating through the refrigerant natural circulation circuit during cooling operation in the refrigerant natural circulation mode.

The cooling system of the invention controls an internal temperature of the enclosure of the housing by regulating the quantity of refrigerant circulating through the refrigerant natural circulation circuit during cooling operation in the refrigerant natural circulation mode.

The cooling system of the invention has control means for effecting/stopping ventilation operation on the basis of the temperatures detected by the first and second temperature detection means.

In the cooling system of the invention, the control means carries out/stops the ventilation operation in accordance with a signal input from the outside.

The cooling system of the invention has a fireproof damper having a detection function which opens and closes according to the circumstances of a setting environment.

The cooling system of the invention has a battery disposed in the enclosure of the cooling system main body and performs cooling operation by means of the battery in the event of a power failure.

The cooling system of the invention has a hood provided on a portion of the cooling system main body which is exposed to outside air and makes a direction in which an exhaust heat air current is directed orthogonal to a direction of a suction air current.

The invention set forth renders small an equipment installation space required by the cooling system. Further, there can be achieved a reduction in the number of pieces of equipment installed, simplification of setting work, and a reduction in the time required for examining installation positions for the equipment required to be set in the vicinity of internal heat-generation equipment. Moreover, projections and indentations in the cooling system become smaller, thereby enhancing the appearance of the cooling system.

Switching between cooling modes is performed through appropriate control operation, thereby reducing the power consumption required for cooling operation. In the event of an abnormal increase having arisen in the temperature of internal air of the housing, internal equipment can be protected by performing cooling operation through use of a ventilator. In the case of a cooling system having a built-in natural circulation circuit, a condenser, an evaporator, and a coolant pipe for connecting the condenser and the evaporator is assembled beforehand in the cooling system, thereby preventing occurrence of a failure; that is a failure to impart a downward slope to the pipe, which would otherwise be caused by a failure in setting work of the cooling system.

BRIEF DESCRIPTION OF THE DRAWINGS

FIG. 5 is a view showing a method for controlling the cooling system of the second embodiment of the invention;

FIG. 6 is a view showing a method for controlling the cooling system of the second embodiment of the invention;

BEST MODES FOR IMPLEMENTING THE INVENTION

Embodiments of the invention will now be described by taking, as an example, a cooling system which cools the inside of a enclosure of a housing for housing equipment including heat-generating elements, and by reference to the drawings.

First Embodiment

Figure 1:
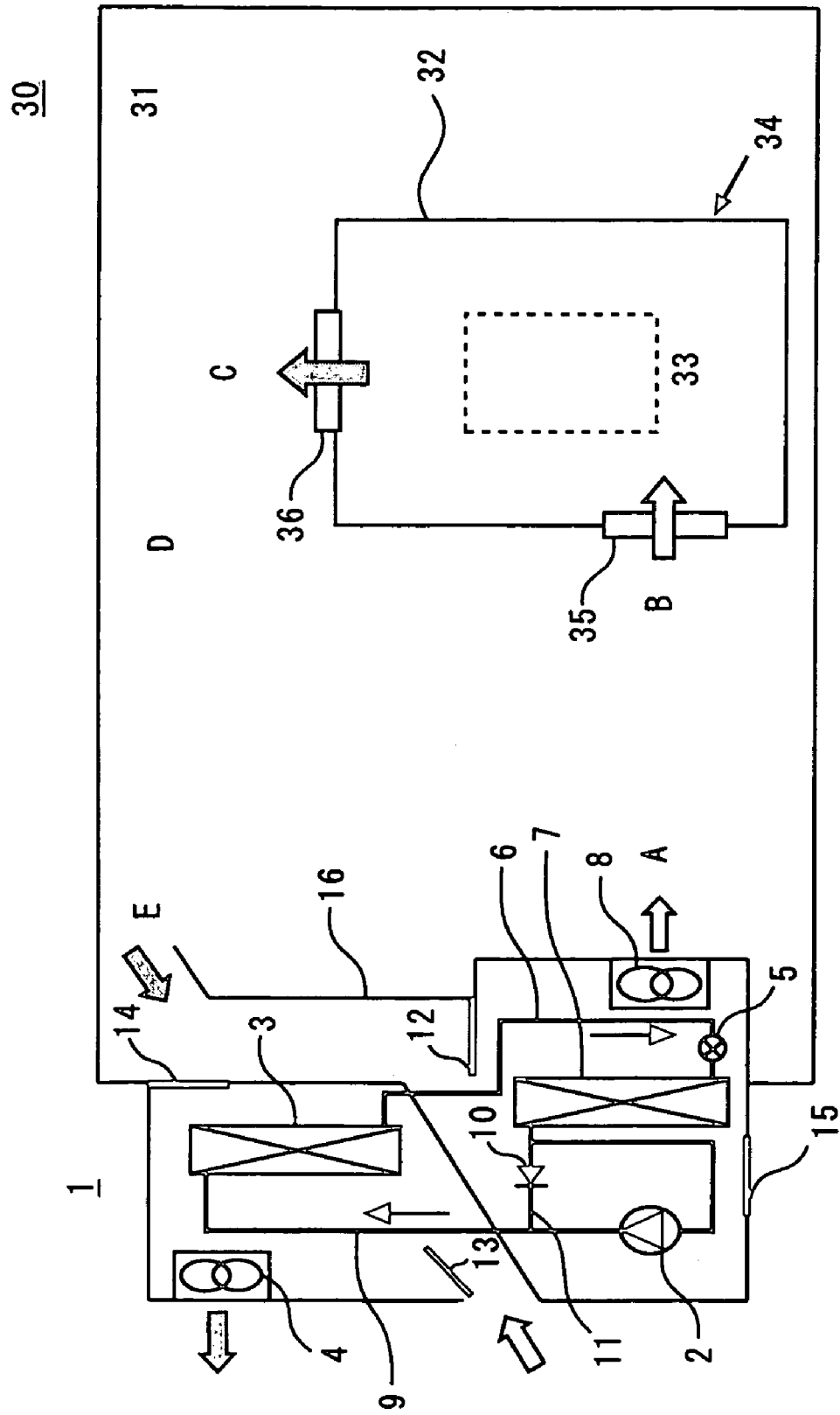
FIG. 1 is a schematic block diagram showing a cooling system of a first embodiment of the invention disposed in a housing when it is in cooling operation during non-ventilation operation.
Figure 2:
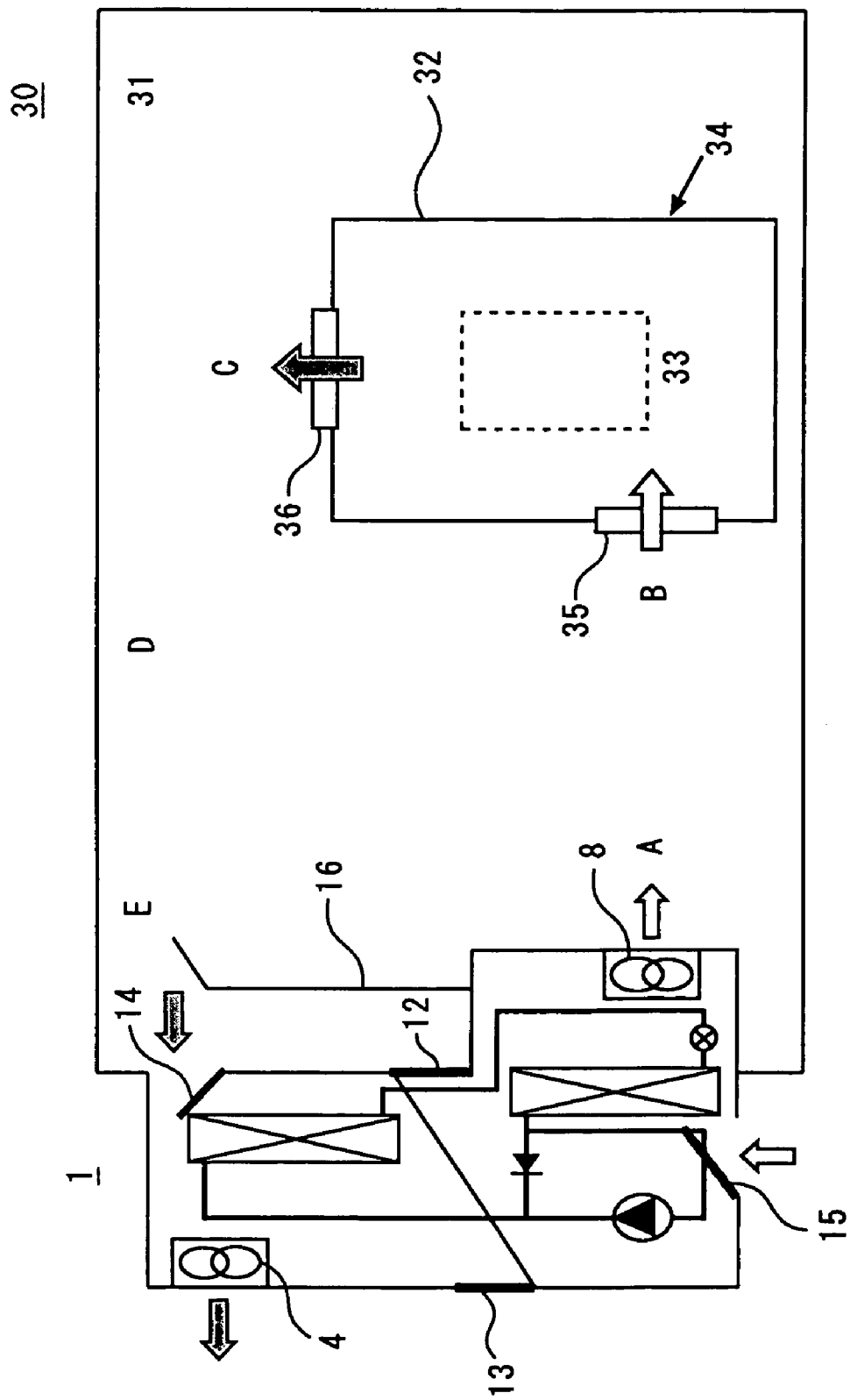
FIG. 2 is a schematic block diagram showing the cooling system of the first embodiment of the invention disposed in the housing during ventilation operation.

FIGS. 1 and 2 are schematic block diagrams showing a cooling system according to a first embodiment of the invention. FIG. 1 shows a refrigerant forced circulation mode and a refrigerant natural circulation mode; that is, an operating state in a non-ventilation mode. FIG. 2 shows an operating state of the cooling system in a ventilation mode.

Throughout the drawings, reference numeral 1 designates a cooling system; 2 designates a compressor; 3 designates a condenser; 4 designates an outdoor fan; 5 designates an expansion valve, e.g., an electronic expansion valve; 6 designates a liquid pipe; 7 designates an evaporator; 8 designates an indoor fan; 9 designates a gas pipe; 10 designates an open-close valve, e.g., a check valve; and 11 designates a compressor bypass pipe. Reference numeral 12 designates an indoor air inlet port; 13 designates an outside air inlet port; 14 designates a ventilation indoor air inlet port; 15 designates a ventilation outside air inlet port; and 16 designates a guide plate. The cooling system 1 is attached to a side surface of an enclosure 31 of a housing (or a storage box) 30. In the drawing, arrows denote flowing directions of refrigerant and flowing directions of air. Reference numeral 32 designates heat-generating equipment; 33 designates a heat-generating component; 34 designates a case; 35 designates an air intake; and 36 designates an air outlet.

The electronic expansion valve 5 is an expansion valve which can be controlled from the outside so as to enable setting of an opening by means of an electric current used for energization. In the embodiment, an opening set for the refrigerant forced circulation operation differs from that set for the refrigerant natural circulation operation, and switching between the openings is effected. The gas pipe 9 is a pipe extending from an outlet of the evaporator 7 to an inlet of the condenser 3. The liquid pipe 6 is a pipe extending from an outlet of the condenser 3 to an inlet of the evaporator 7. The diameter of the gas pipe 9 is set so as to become 1.5 to 2 times that of the liquid pipe 6, to thereby make the gas pipe 9 larger than the liquid pipe 6. In the embodiment, fluorine-based refrigerant, e.g., R22 or R407C, is used as a refrigerant. Further, for example, a scroll compressor is used as the compressor. In addition, for example, alkylbenzene oil or ester oil is used as refrigerating machine oil. However, the refrigerant, the compressor, and the refrigerating machine oil are not limited to these. Another refrigerant, another compressor, and another refrigerating machine oil may also be used.

As shown in FIGS. 1 and 2, the cooling system 1 is made up of a refrigerant circuit for switching between refrigerant forced circulation operation and refrigerant natural circulation operation, and an air flow passage for switching between ventilation operation and non-ventilation operation. The refrigerant circuit is constituted of the compressor 2 for compressing a refrigerant gas; the condenser 3 for cooling and liquefying the refrigerant gas; the outdoor fan 4 for forcedly blowing outside air to an outer surface of the condenser 3; the electronic expansion valve 5 which decompresses a hot, high-pressure refrigerant liquid output from the condenser 3, to thereby bring the refrigerant into two-phase wet steam; the compressor bypassing pipe 11 equipped with the check valve 10 for bypassing the compressor 2 during a natural circulation operation; the evaporator 7 which evaporates the wet steam having flowed from the liquid pipe 6 into refrigerant gas by means of cooling load in a room which is a space to be cooled; and the indoor fan 8 for forcefully blowing indoor air to the outer surface of the evaporator 7. The condenser 3 is located at a position higher than the evaporator 7.

In order to switch the air flow passage between the ventilation operation and the non-ventilation operation, the air flow passage has the ventilation indoor air inlet port 14 and the ventilation outside air inlet port 15, which are opened in a ventilation mode; and the indoor air inlet port 12 and the outside air inlet port 13, which are opened in a non-ventilation mode.

The cooling system is utilized at a location which requires cooling throughout the year. When the room temperature is lower than the temperature of outside air, refrigerant forced circulation operation which brings the compressor 2 into an operating state is performed. In contrast, when the room temperature is higher than the temperature of the outside air, the compressor 2 is brought to a halt, thus performing a refrigerant natural circulation operation utilizing the coldness of the outside air.

Operation of the cooling system will now be described.

First, the refrigerant forced circulation operation to be performed when the temperature of the outside air is higher than the room temperature will be described.

In the case of use of, e.g., the electronic expansion valve 5 having a full throttle setting of 2000 pulses, the opening of the electronic expansion valve 5; that is, an opening appropriate for decompressing the refrigerant liquid flowing from the condenser 3 into two-phase wet steam, is set to about 15% the full throttle setting; for example, 300 pulses. When the compressor 2 is operated, the check valve 10 is closed by a pressure difference between the discharge pressure of the compressor 2 and the inlet pressure of the same, thereby constituting a forced circulation operation cycle. Specifically, the refrigerant gas in the pipe is compressed adiabatically by the compressor 2, to thereby become superheated. The heat of the thus-superheated refrigerant gas is discharged to the outside air by means of the condenser 3, whereupon the gas becomes liquefied into refrigerant liquid. Subsequently, the high-pressure refrigerant liquid flows through the electronic expansion valve 5, where the liquid is decompressed by the electronic expansion valve 5 to become low-temperature, low-pressure wet steam of a gas-liquid mixed state. The refrigerant further flows through the liquid pipe 6 and absorbs heat of vaporization in the evaporator 7, to thereby become refrigerant gas. The gas returns to the compressor 2 by way of the gas pipe 9.

Next, natural circulation operation to be performed when the temperature of the outside air is lower than the room temperature will be described.

When the opening of the electronic expansion valve 5 is increased to full throttle for reducing a pressure loss in the refrigerant circuit, the check valve 10 is opened by means of flow of the refrigerant, thereby constituting a natural circulation operation cycle. The refrigerant liquid condensed by the condenser 3 descends within the liquid pipe 6 under the influence of gravity, to thereby enter the evaporator 7. The refrigerant liquid having flowed into the evaporator 7 is subjected to thermal load in the room, to thereby become evaporated. The thus-evaporated refrigerant then ascends within the gas pipe 9, to thereby return to the condenser 3 by way of the check valve 10 of the compressor bypass pipe 11. The refrigerant also attempts to flow into the passage passing through the compressor 2. However, flow resistance in the compressor 2 is much higher than that of the compressor bypass pipe 11. For this reason, the quantity of refrigerant flowing through the compressor 2 becomes negligibly small when compared with the quantity of refrigerant flowing through the compressor bypass pipe 11.

Next, the state of the air flow passage achieved during the refrigerant forced circulation operation and that achieved during the refrigerant natural circulation operation; namely, the state of the air flow passage achieved during the non-ventilation operation, will be described by reference to FIG. 1.

The ventilation indoor air inlet port 14 and the ventilation outside air inlet port 15 are closed, and the indoor air inlet port 12 and the outside air inlet port 13 are opened. As a result, outside air flows into the enclosure of the cooling system 1 from the outside air inlet port 13, absorbs the heat of the refrigerant by means of the condenser 3, and is discharged into the outside air from the outdoor fan 4. In relation to the air in the enclosure 31 of the housing 30, higher-temperature air located at upper portion in the enclosure 31 is caused to enter the enclosure of the cooling system 1 by means of the guide plate 16 by way of the indoor air inlet port 12. The air passes through the evaporator 7, to thereby impart heat to the coolant. The air is then cooled and blown into the inside of the enclosure 31 by means of the indoor fan 8.

The state of the air flow passage during ventilation operation will now be described by reference to FIG. 2.

In the case of the cooling system of the embodiment, when an anomalous increase has arisen in the internal temperature of the enclosure for reasons of a failure in the compressor, outside air is introduced by means of ventilation operation, to thereby cool the inside of the enclosure and protect the heat-generating equipment disposed in the enclosure.

During the ventilation operation, the ventilation indoor air inlet port 14 and the ventilation outside air inlet port 15 are opened, and the indoor air inlet port 12 and the outside air inlet port 13 are closed. As a result, the air in the enclosure 31 of the housing 30 enters the enclosure of the cooling system 1 from the ventilation indoor air inlet port 14 and is discharged to the outside air by way of the outdoor fan 4. The outside air enters the enclosure of the cooling system 1 from the ventilation outside air inlet port 15 and is blown into the enclosure 31 by way of the indoor fan 8.

Next will be described the way in which the inside of the housing is cooled by the air that has been blown out of the cooling system 1 during the refrigerant forced circulation, the refrigerant natural circulation, or the ventilation operation.

The air blown out of the cooling system 1 is taken into the case 34 from the air intake 35 of the heat-generating equipment 32, to thereby cool the heat-generating component 33. The air then becomes hot air and is blown into the enclosure 31 from the air outlet 36 provided at an upper portion of the case. In this way, the air in the enclosure 31 circulates sequentially from positions "A, B, C, D, and E", thereby cooling the heat-generating equipment 32.

In this way, in the embodiment, the cooling system has the refrigerant forced circulation mode, the refrigerant natural circulation mode, and the ventilation mode. These refrigerant circulation modes are switched according to the temperature of the outside air and the room temperature. When an anomalous increase has arisen in the internal temperature of the housing, ventilation operation is to be performed. The power required to perform the natural circulation operation consists of only the power input to the outdoor fan 4 and the power input to the indoor fan 8. Hence, annual electric power consumption can be curtailed significantly. Further, since an increase in ambient temperature of the heat-generating equipment provided in the housing through ventilation operation is inhibited, the cooling system has redundancy that can cope with the case of a failure in the compressor of the cooling system.

In the embodiment, functions of the refrigerant forced circulation circuit, those of the refrigerant natural circulation circuit, and those of the ventilator are integrated into a single cooling system. Hence, spaces which have hitherto been required to provide a plurality of pieces of equipment become unnecessary, thereby simplifying setting work and offering superior appearance with fewer projections and indentations.

The position of the condenser 3, that of the evaporator 7, that of the liquid pipe 6, and that of the gas pipe 9 are fixed beforehand at the time of manufacturing operation. Hence, arrangement of a refrigerant pipe, which would otherwise be required when the cooling system 1 is attached to the housing 30, becomes obviated. Thus, occurrence of a failure in refrigerant natural circulation operation, which would otherwise be caused by inappropriate pipe arrangement, can be avoided.

At the time of the refrigerant natural circulation operation and ventilation operation of the cooling system 1, greater cooling capability is exhibited with an increase in the difference between the internal temperature of the enclosure 31 and the temperature of the outside air achieved when air is taken into the enclosure 31. For this reason, suction of hot air as close as possible to the heat-generating component 33 is efficient. To this end, the guide plate 16 is desirably disposed to induce hot air. As a result, the hot air is taken into the cooling system 1 while the temperature of the hot air that is blown out of the air outlet 36 of the heat-generating equipment 32 and situated at position "C" is substantially maintained. Thus, the air can be taken as air situated at position "E".

Second Embodiment

Figure 3:
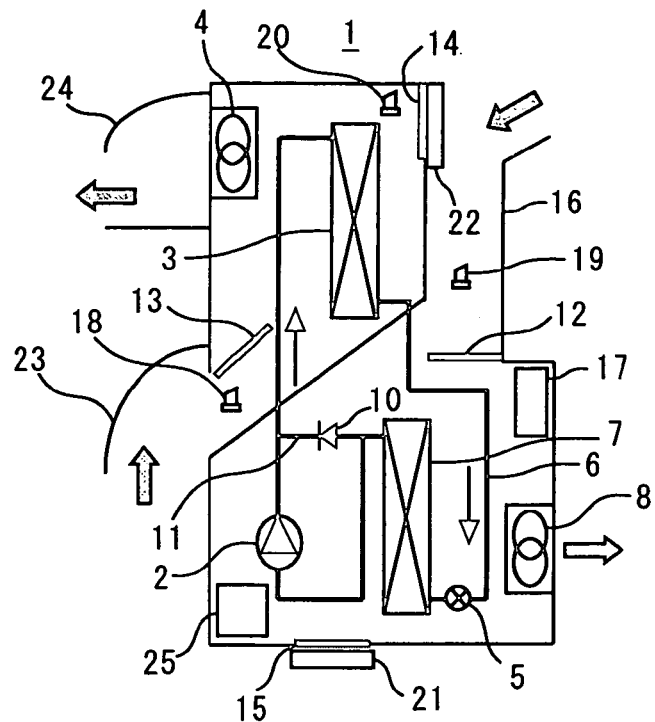
FIG. 3 is a schematic block diagram showing a cooling system of a second embodiment of the invention disposed in a housing when it is in cooling operation during non-ventilation operation.
Figure 4:
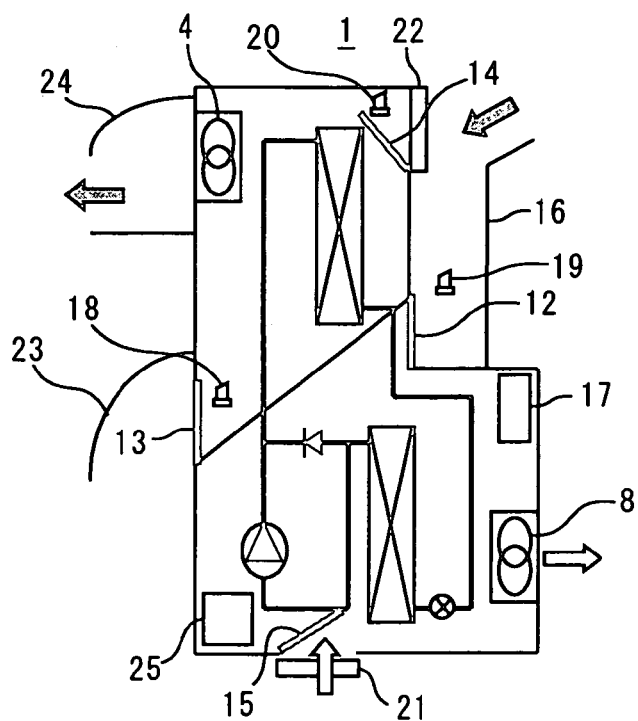
FIG. 4 is a schematic block diagram showing the cooling system of the second embodiment of the invention disposed in the housing during ventilation operation.

FIGS. 3 and 4 are schematic block diagrams showing a cooling system of a second embodiment of the invention. FIG. 3 shows the refrigerant natural circulation operation and the refrigerant forced circulation operation; that is, the non-ventilation operation. FIG. 4 shows a ventilation operation. In FIGS. 3 and 4, those elements which are identical with or correspond to those shown in FIG. 1 are assigned the same reference numerals, and their detailed explanations are omitted.

Throughout the drawings, reference numeral 17 designates a controller; 18 designates an outside air temperature sensor serving as first temperature detection means; 19 designates a room temperature sensor serving as second temperature detection means; 20 designates temperature detection means; 21 designates a fireproof damper; 22 designates a fireproof damper; 23 designates an intake hood; 24 designates a blowout hood; and 25 designates a battery.

The cooling system 1 is equipped with the controller 17 formed from, e.g., a microcomputer. In this embodiment, the controller 17 has control means for controlling the compressor 2, the outdoor fan 4, the indoor fan 8, the indoor air inlet port 12, the outside air inlet port 13, the ventilation indoor air inlet port 14, and the ventilation outside air inlet port 15, by reference to the outside air temperature sensor 18 for detecting the temperature of outside air and the room temperature sensor 19 for detecting the temperature of the air in the enclosure of the housing.

Operation of the cooling system will now be described by reference to FIGS. 5 and 6.

Details of charts shown in FIGS. 5 and 6 are set and stored in the memory of the controller 17. When the outside air temperature sensor 18 detects the temperature of outside air and when the room temperature sensor 19 detects the temperature of the air in the enclosure of the housing (i.e., the room temperature), control operation is performed on the basis of FIGS. 5 and 6 in terms of the relationship between the temperature of the outside air and the room temperature. Threshold values to be used for determining a control state by reference to FIG. 5 are achieved when the room temperature assumes T1 (e.g., 20° C.); when the room temperature assumes T2 (e.g., 30° C.); when the room temperature assumes T3 (e.g., 35° C.); when the temperature of the outside air is equal to the room temperature; and when the temperature of the outside air is equal to the sum of the room temperature and a correction value.

Here, a correction value to be used for comparing the temperature of outside air and the room temperature is set on the basis of a difference between the temperature of the outside air and the room temperature achieved when there is attained a balance between the quantity of heat produced by the heat-generating equipment stored in the housing and the cooling capability achieved at the time of refrigerant natural circulation of the cooling system. Specifically, in the second embodiment, when a small difference exists between the room temperature and the temperature of the outside air and when cooling capability stemming from refrigerant natural circulation cannot be exhibited, cooling is achieved by performing refrigerant forced circulation operation.

When the room temperature is high and there is a chance of occurrence of a failure in the heat-generating equipment, the cooling system is determined to be anomalous. There is performed the ventilation operation that involves outside air intake, to thereby inhibit an increase in the room temperature and prevent occurrence of a failure in the heat-generating equipment. This determination is made by the room temperature and the temperature of the outside air. The control state of the cooling system may be switched when a contact signal indicating an anomalous state is input from the outside.

As the volume of ventilation air becomes larger, a rise in room temperature can be reduced. In many cases, the volume of air is set to a low level during non-ventilation operation, in order to prevent occurrence of excessive noise. However, at the time of ventilation operation which is in an anomalous state, control may be performed for switching the volume of air to a larger volume of air by increasing the revolution-speed of the outdoor fan and indoor fan of the cooling system. If an increase arises in room temperature despite ventilation operation, it is safe to switch the operation to control operation for reporting the increase to a control center of the housing under conditions previously set in the controller.

In FIG. 5, a buffer band may be set for a threshold temperature at which a control state is to be changed, thereby preventing the chattering of control operation.

At the time of refrigerant natural circulation operation, when the temperature of the outside air is low and room temperature is excessively low, the opening of the electronic expansion valve 5 may be regulated, to thereby control the flow rate of refrigerant for the refrigerant natural circulation and adjusting the room temperature. Such a control operation prevents chattering of control operation between the refrigerant natural circulation operation and a halt state.

When the room temperature drops at the time of natural refrigerant circulation operation, to thereby halt the cooling operation stemming from refrigerant natural circulation operation, it may be the case that only the outdoor fan 4 is stopped, to thereby make operation of the indoor fan 8 continuous. As a result, the air in the housing is agitated, to there render the temperature constant while a drop in the room temperature is stopped. Thus, the room temperature sensor 19 can detect the room temperature while an increase in the ambient temperature of the heat-generating equipment is inhibited.

In the embodiment, the cooling system has temperature detection means 20, e.g., a thermal fuse. In the event that fire has arisen in the enclosure of the housing, the temperature detection means 20 detects a temperature rise, and the fireproof dampers 21, 22 are activated according to the thus-detected temperature. Specifically, in the embodiment, even if fire has arisen, the fireproof dampers are activated, thereby preventing the spread of fire, which would otherwise occur from the enclosure by way of the opening section of the cooling system.

In the embodiment, the intake hood 23 and the blowout hood 24 are provided on a portion of the cooling system exposed to outside air. The hoods are provided such that, during the non-ventilation operation, a draft direction in which outside air is taken in by way of the intake hood 23 becomes orthogonal to a draft direction in which air is blown to the outside air by way of the blowout hood 24. The cooling system has a structure which prevents deterioration of cooling capability of the cooling system by preventing occurrence of a short cycle, which would otherwise be caused by taking in the hot air that has been subjected to heat transfer during the cooling operation.

When the housing is provided with a battery for supplying power to the heat-generating equipment in the event of a power failure, the heat-generating equipment produces heat even in the event of the power failure, and hence the heat-generating components must be cooled.

In the embodiment, the cooling system is driven with d.c. power, and the battery 25 is provided in the enclosure of the cooling system. Under normal circumstances, the cooling system is operated by means of the power obtained by converting commercial power into d.c. power. Even in the event of a power failure, power is switched to the built-in battery 25, thereby performing cooling operation.

As a result of the cooling system being driven with d.c. power, the cooling system can perform cooling operation with power supplied from the battery provided in the housing prepared for the heat-generating equipment even when the cooling system is not equipped with the battery 25.

By means of controlling the cooling system such that the cooling operation achieved at the time of driving of a battery is switched to ventilation operation, the life of the battery can also be extended by ensuring cooling capacity and reducing the power dissipated by the cooling system.

Third Embodiment

Figure 7:
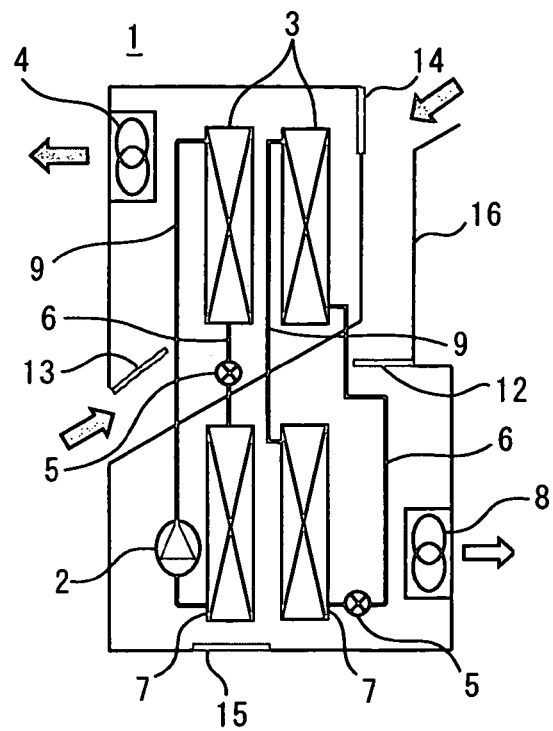
FIG. 7 is a schematic block diagram showing a cooling system of a third embodiment of the invention.

FIG. 7 is a schematic block diagram showing a cooling system according to a third embodiment of the invention. In FIG. 7, those elements which are identical with or correspond to those shown in FIG. 1 are assigned the same reference numerals, and their detailed explanations are omitted.

As shown in FIG. 7, the cooling system of the embodiment is separately equipped with a refrigerant circuit for refrigerant forced circulation operation and a refrigerant circuit for refrigerant natural circulation operation. The two refrigerant circuits share the outdoor fan and the indoor fan.

Operation of the cooling system will now be described by reference to FIG. 8.

Figure 8:
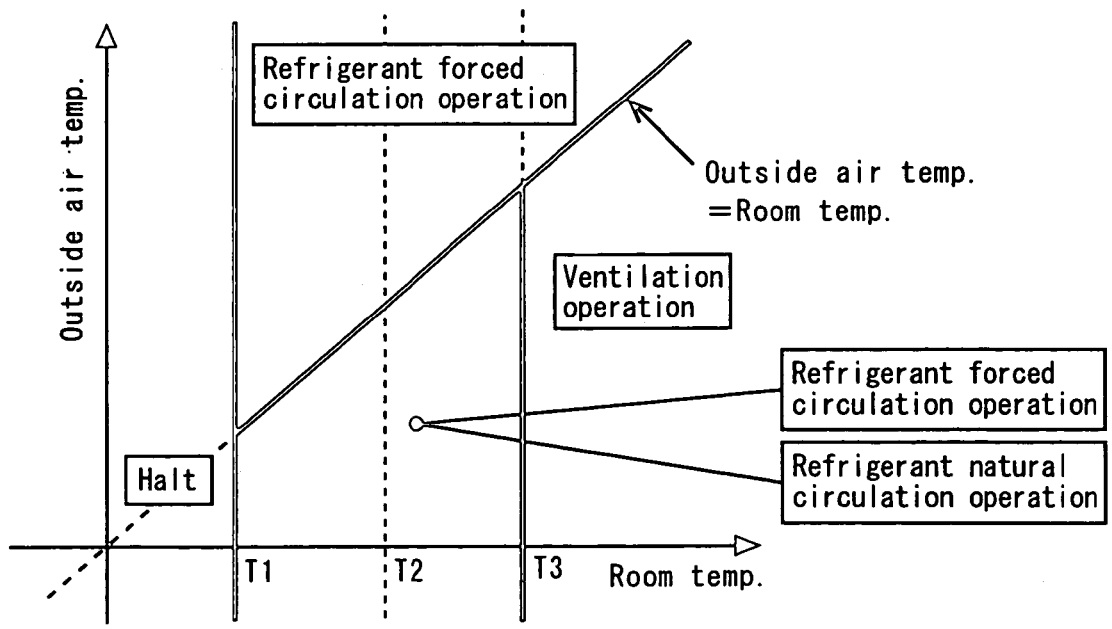
FIG. 8 is a view showing a method for controlling the cooling system of the third embodiment of the invention.
Figure 9:
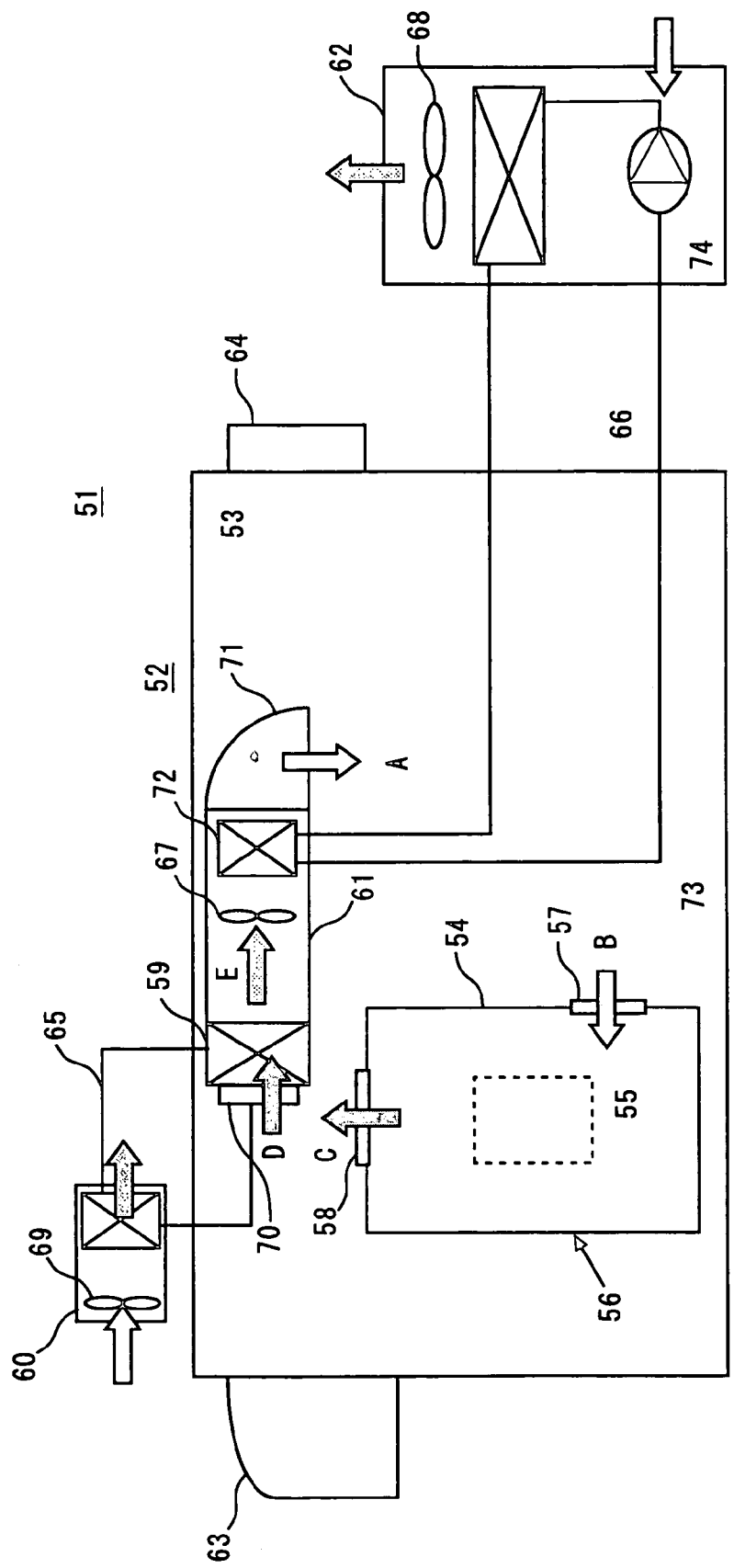
FIG. 9 is a schematic block diagram showing a conventional enclosure cooling system of a housing.

According to the chart shown in FIG. 8, the cooling system performs control operation on the basis of the temperature obtained by the outside air temperature sensor (not shown) and the room temperature sensor (not shown). Specifically, when the temperature of the outside air is higher than the room temperature, the compressor 2 is operated, to thereby perform cooling operation through refrigerant forced circulation. If the temperature of the outside air is lower than the room temperature, the electronic expansion valve 5 of the natural circulation refrigerant circuit is brought to full throttle, to thereby cooling operation through refrigerant natural circulation in addition to the refrigerant forced circulation operation. Thus, the power dissipated by the compressor 2 is curtailed.

When the room temperature has dropped to a level lower than T1, the compressor 2 and the outdoor fan 4 are brought to a halt, thereby preventing excessive cooling. The air in the housing is agitated by making operation of the indoor fan 8 continuous, thereby enabling detection of the room temperature with the room temperature sensor while occurrence of a local rise in the ambient temperature of the heat-generating equipment is prevented.

When the room temperature is higher than T3 and the temperature of the outside air is lower than the room temperature, the compressor 2 is brought to a halt. The indoor air inlet port 12 and the outside air inlet port 13 are closed, and the ventilation indoor air inlet port 14 and the ventilation outdoor air inlet port 15 are opened, thereby effecting ventilation operation.

In FIG. 8, chattering of control operation may be prevented by providing the threshold temperature at which a control state is to be switched with a buffer band.

INDUSTRIAL APPLICABILITY

As mentioned above, the invention provides a cooling system which cools the inside of an enclosure of a housing accommodating equipment including a heat-generating element, the system comprising heat exchange means constituted of a plurality of heat exchange modes, wherein the heat exchange means is housed in one enclosure. Hence, the cooling system is useful as a cooling system which renders small an equipment installation space required by the cooling system and enables a reduction in the number of pieces of equipment installed, simplification of setting work, and a reduction in the time required for examining installation positions for the equipment required to be set in the vicinity of internal heat-generation equipment.

According to the invention, the plurality of heat exchange modes include a refrigerant forced circulation mode, a refrigerant natural circulation mode, and a ventilation mode. Switching between cooling modes is performed through appropriate control operation, thereby reducing the power consumption required for cooling operation. In the event of an abnormal increase having arisen in the temperature of internal air of the housing, internal equipment can be protected by performing cooling operation through use of a ventilator. The cooling system can be used as a cooling system, wherein, in the case of a cooling system having a built-in natural circulation circuit, a condenser, an evaporator, and a coolant pipe for connecting the condenser and the evaporator is assembled beforehand in the cooling system, thereby preventing occurrence of a failure; that is, a failure to impart a downward slope to the pipe, which would otherwise be caused by a failure in setting work of the cooling system.

According to the cooling system of the invention, a cooling system main body is attached to a side surface of the enclosure of the housing. Hence, the cooling system is useful as a cooling system which enables simplification of setting work.

According to the cooling system of the invention, a refrigerant forced circulation circuit of the refrigerant forced circulation mode and a refrigerant natural circulation circuit of the refrigerant natural circulation mode are constituted as a single refrigerant circuit. In the case of a cooling system which can perform cooling operation while switching between a refrigerant circuit for forced circulation to be performed by the compressor and a refrigerant circuit for natural circulation, cooling is performed through natural circulation operation when the temperature of the outside air is low. When insufficient cooling capacity is achieved through natural circulation operation, cooling operation is performed by driving the compressor. Hence, the cooling system is useful as a cooling system capable of curtailing power consumption and extending the life of the compressor.

According to the invention, a refrigerant forced circulation circuit of the refrigerant forced circulation mode and a refrigerant natural circulation circuit of the refrigerant natural circulation mode are respectively constituted as different refrigerant circuits. In the case of a cooling system which can simultaneously perform cooling operation in conjunction with the refrigerant circuit for forced circulation to be performed by the compressor and the refrigerant circuit for natural circulation, cooling is performed simultaneously by means of the refrigerant natural circulation operation and the refrigerant forced circulation operation of the compressor when the room temperature is higher than the temperature of the outside air. When the room temperature is lower than the temperature of the outside air, cooling operation is performed through the refrigerant forced circulation operation to be performed by the compressor. Hence, the cooling system is useful as a cooling system capable of diminishing power consumption and prolonging the life of the compressor.

According to the invention, the cooling system has first temperature detection means for detecting the temperature of outside air, and second temperature detection means for detecting an internal temperature of the enclosure of the housing. On the basis of the temperatures detected by the first and second temperature detection means and a preset correction value, there is effected switching between the refrigerant forced circulation circuit and the refrigerant natural circulation circuit. When the inability to exhibit the cooling capability of the refrigerant natural circulation operation is determined on the basis of the detected temperature of the room and the detected temperature of the outside air, control operation is performed for preventing cooling operation, which would otherwise be induced by refrigerant natural circulation operation. Thus, the cooling system is useful as a cooling system capable of avoiding expense of unnecessary running costs.

According to the invention, an internal temperature of the enclosure of the housing is controlled by regulating the quantity of refrigerant circulating through the refrigerant natural circulation circuit during cooling operation in the refrigerant natural circulation mode. Hence, the cooling system is useful as a cooling system capable of preventing excessive cooling.

According to the invention, control operation is performed for stopping an outdoor fan during cooling operation in the refrigerant natural circulation mode when the natural refrigerant circulation operation has become unnecessary as a result of a drop in the internal temperature of the enclosure of the housing. Hence, the cooling system is useful as a cooling system capable of preventing excessive cooling and curtailing unnecessary running costs.

According to the invention, the cooling system has control means for effecting/stopping ventilation operation on the basis of the temperatures detected by the first and second temperature detection means. Hence, the cooling system is useful as a cooling system which can protect internal equipment by switching the cooling operation to the ventilation mode when an anomalous rise in the temperature of the enclosure of the housing has been detected.

According to the invention, the control means carries out/stops the ventilation operation in accordance with a signal input from the outside. The cooling system is useful as a cooling system which can protect equipment provided in the housing by switching the cooling operation to cooling operation of ventilation mode in accordance with a signal input from the outside.

According to the invention, the cooling system has a fireproof damper having a detection function which opens and closes according to the circumstances of a setting environment. The cooling system is useful as a cooling system, wherein, in the event that fire has arisen in the enclosure, the fireproof damper is closed upon detection of an anomaly in the internal temperature of the enclosure, thereby preventing spread of the fire to the outside.

According to the invention, a battery is disposed in the enclosure of the cooling system main body, and the cooling system performs cooling operation by means of the battery in the event of a power failure. Hence, the cooling system can perform cooling operation with backup power in the event of a power failure by causing the cooling system to operate with d.c. power. Hence, internal equipment of the housing can be protected. In the case of a cooling system having a battery provided in the enclosure of the cooling system, the cooling system can perform cooling operation with a built-in battery during a power failure. Hence, the cooling system is useful as a cooling system capable of protecting the internal equipment of the housing.

According to the invention, a hood is provided on a portion of a cooling system main body which is exposed to outside air and makes a direction in which an exhaust heat air current is directed orthogonal to a direction of a suction air current. Hence, the cooling system is useful as a cooling system capable of preventing a drop in cooling capability, which would otherwise be caused by a short cycle caused by taking in the hot air that has been subjected to heat exchange during the cooling operation.

What is claimed is:

1. A cooling system which cools the inside of an enclosure of a housing accommodating equipment including a heat-generating element housed within a case, the system comprising heat exchange means constituted of a plurality of heat exchange modes, wherein the heat exchange means is housed in one enclosure, and wherein the heat exchange means does not constitute part of the case.

2. A cooling system which cools the inside of an enclosure of a housing accommodating equipment including a heat-generating element, the system comprising heat exchange means constituted of a plurality of heat exchange modes, wherein the heat exchange means is housed in one enclosure, wherein the plurality of heat exchange modes include a refrigerant forced circulation mode, a refrigerant natural circulation mode, and a ventilation mode.

3. A cooling system which cools the inside of an enclosure of a housing accommodating equipment including a heat-generating element, the system comprising heat exchange means constituted of a plurality of heat exchange modes, wherein the heat exchange means is housed in one enclosure, wherein a cooling system main body is attached to a side surface of the enclosure of the housing.

4. A cooling system which cools the inside of an enclosure of a housing accommodating equipment including a heat-generating element, the system comprising heat exchange means constituted of a plurality of heat exchange modes, wherein the heat exchange means is housed in one enclosure, wherein the plurality of heat exchange modes include a refrigerant forced circulation mode, a refrigerant natural circulation mode, and a ventilation mode, wherein a refrigerant forced circulation circuit of the refrigerant forced circulation mode and a refrigerant natural circulation circuit of the refrigerant natural circulation mode are constituted as a single refrigerant circuit.

5. The cooling system according to claim 2, wherein a refrigerant forced circulation circuit of the refrigerant forced circulation mode and a refrigerant natural circulation circuit of the refrigerant natural circulation mode are respectively constituted as different refrigerant circuits.

6. The cooling system according to claim 4, further comprising first temperature detection means for detecting a temperature of outside air, and second temperature detection means for detecting an internal temperature of the enclosure of the housing, wherein, on the basis of the temperatures detected by the first and second temperature detection means and a preset correction value, there is effected switching between the refrigerant forced circulation circuit and the refrigerant natural circulation circuit.

7. A cooling system which cools the inside of an enclosure of a housing accommodating equipment including a heat-generating element, the system comprising heat exchange means constituted of a plurality of heat exchange modes, wherein the heat exchange means is housed in one enclosure, wherein the plurality of heat exchange modes include a refrigerant forced circulation mode, a refrigerant natural circulation mode, and a ventilation mode, wherein an internal temperature of the enclosure of the housing is controlled by regulating a quantity of refrigerant circulating through a refrigerant natural circulation circuit during cooling operation in the refrigerant natural circulation mode.

8. A cooling system which cools the inside of an enclosure of a housing accommodating equipment including a heat-generating element, the system comprising heat exchange means constituted of a plurality of heat exchange modes, wherein the heat exchange means is housed in one enclosure, wherein the plurality of heat exchange modes include a refrigerant forced circulation mode, a refrigerant natural circulation mode, and a ventilation mode, wherein control operation is performed for stopping an outdoor fan during cooling operation in the refrigerant natural circulation mode when the natural refrigerant circulation operation has become unnecessary as a result of a drop in an internal temperature of the enclosure of the housing.

9. The cooling system according to claim 6, further comprising control means for effecting/stopping ventilation operation on the basis of the temperatures detected by the first and second temperature detection means.

10. The cooling system according to claim 9, wherein the control means carries out/stops the ventilation operation in accordance with a signal input from the outside.

11. A cooling system which cools the inside of an enclosure of a housing accommodating equipment including a heat-generating element, the system comprising heat exchange means constituted of a plurality of heat exchange modes, wherein the heat exchange means is housed in one enclosure, further comprising a fireproof damper having a detection function which opens and closes according to the circumstances of a setting environment.

12. A cooling system which cools the inside of an enclosure of a housing accommodating equipment including a heat-generating element, the system comprising heat exchange means constituted of a plurality of heat exchange modes, wherein the heat exchange means is housed in one enclosure, further comprising a battery disposed in the enclosure of the cooling system main body, wherein cooling operation is performed by means of the battery in the event of a power failure.

13. A cooling system which cools the inside of an enclosure of a housing accommodating equipment including a heat-generating element, the system comprising heat exchange means constituted of a plurality of heat exchange modes, wherein the heat exchange means is housed in one enclosure, further comprising a hood provided on a portion of the cooling system main body which is exposed to outside air and makes a direction in which an exhaust heat air current is directed orthogonal to a direction of a suction air current.

* * * * *